(12) United States Patent
Fischer et al.

(10) Patent No.: US 8,981,348 B2
(45) Date of Patent: Mar. 17, 2015

(54) SEMICONDUCTING ELEMENT, ORGANIC LIGHT EMITTING DISPLAY INCLUDING THE SAME, AND METHOD OF MANUFACTURING THE SEMICONDUCTING ELEMENT

(75) Inventors: Joerg Fischer, Berlin (DE); Arthur Mathea, Berlin, DE (US); Marcus Schaedig, Königs Wusterhausen (DE)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 363 days.

(21) Appl. No.: 11/714,622

(22) Filed: Mar. 5, 2007

(65) Prior Publication Data

US 2008/0138928 A1 Jun. 12, 2008

(30) Foreign Application Priority Data

Dec. 7, 2006 (EP) .................................. 06125574
Jan. 11, 2007 (KR) ...................... 10-2007-0003339

(51) Int. Cl.
*H01L 29/08* (2006.01)
*H01L 51/40* (2006.01)
(Continued)

(52) U.S. Cl.
CPC ........ *H01L 51/0019* (2013.01); *H01L 51/0545* (2013.01); *H01L 27/3244* (2013.01)
USPC .................... 257/40; 257/59; 257/60; 257/72

(58) Field of Classification Search
CPC ............ H01L 51/0545; H01L 27/3244; H01L 51/0541; H01L 27/3274; H01L 27/1214
USPC ........ 257/40, 213, E51.001–E51.005; 438/99
See application file for complete search history.

(56) References Cited

U.S. PATENT DOCUMENTS 5,523,593 A 6/1996 Kagaya et al.
5,739,559 A 4/1998 Kagaya et al.
(Continued)

FOREIGN PATENT DOCUMENTS

GB 2 418 062 A 3/2006
JP 5-275474 A 10/1993
(Continued)

OTHER PUBLICATIONS

Gelinck et al., "Flexible active-matrix displays and shift registers based on solution-processed organic transistors", Nature Materials vol. 3, pp. 106-110 (Feb. 2004).
(Continued)

*Primary Examiner* — Cuong Q Nguyen
(74) *Attorney, Agent, or Firm* — Knobbe Martens Olson & Bear LLP

(57) ABSTRACT

A semiconductor element (semiconductor device) including a substrate having a patterned structure of an organic semiconductor material and a method of manufacturing the semiconductor element are disclosed. According to one embodiment, the method of manufacturing the semiconductor element provides a substrate having a patterned structure of an organic semiconductor material which is cost-effective and which realizes a structure having a high degree of uniformity of the patterned semiconductor regions. The method includes: providing the substrate, applying a continuous layer of an organic semiconductor material onto the substrate, applying a solvent onto the continuous layer in the second regions thereby dissolving and removing the organic semiconductor material, which is located in the second regions, from the continuous layer.

6 Claims, 7 Drawing Sheets

(51) Int. Cl.
*H01L 51/00* (2006.01)
*H01L 51/05* (2006.01)
*H01L 27/32* (2006.01)

(56) References Cited

U.S. PATENT DOCUMENTS

| | | | |
|---|---|---|---|
| 2002/0022299 | A1 | 2/2002 | Jackson |
| 2005/0140840 | A1* | 6/2005 | Hirakata et al. ............... 349/43 |
| 2006/0024859 | A1 | 2/2006 | Wu et al. |
| 2006/0099526 | A1 | 5/2006 | Yang |
| 2006/0131573 | A1 | 6/2006 | Arai et al. |
| 2006/0267002 | A1* | 11/2006 | Fischer et al. ............... 257/40 |

FOREIGN PATENT DOCUMENTS

| | | |
|---|---|---|
| JP | 06-036982 | 2/1994 |
| JP | 7-263644 A | 10/1995 |
| JP | 2003-041014 | 2/2003 |
| JP | 2003-086366 | 3/2003 |
| JP | 2005-108626 | 4/2005 |
| JP | 2006-004989 | 1/2006 |
| JP | 2006-49891 A | 2/2006 |
| JP | 1744342 | 3/2006 |
| JP | 2006-140436 A | 6/2006 |
| KR | 10-2005-0077525 | 8/2005 |
| KR | 10-2006-0062260 | 6/2006 |
| WO | WO 01/17041 A1 | 3/2001 |
| WO | WO 01/47044 A2 | 6/2001 |

OTHER PUBLICATIONS

Volkman et al., "Inkjetted organic transistors using a novel pentacene precursor", Materials Research Society Symp. Proc., vol. 769 pp. H11.7.1-H11.7.6 (2003).

Kawase et al., "Inkjet printed via-hole interconnections and resistors for all-polymer transistor circuits," *Adv. Mater.* vol. 13, No. 21, pp. 1601-1605, (Nov. 2001).

European Search Report for counterpart EP application No. 06125574.1.

Notice of Allowance issued Jun. 13, 2008 in corresponding Korean Patent Application No. 10-2007-0003339.

Japanese Office Action issued by the Japanese Patent Office dated Jan. 4, 2011, 4 pages.

* cited by examiner

SEMICONDUCTING ELEMENT, ORGANIC LIGHT EMITTING DISPLAY INCLUDING THE SAME, AND METHOD OF MANUFACTURING THE SEMICONDUCTING ELEMENT

CROSS-REFERENCE TO RELATED APPLICATIONS

This application claims the benefit of European Patent Application No. 06 125 574.1, filed on Dec. 7, 2006, in the European Patent Office, and Korean Patent Application No. 10-2007-0003339, filed on Jan. 11, 2007, in the Korean Intellectual Property Office, the disclosures of which are incorporated herein in their entireties by reference.

BACKGROUND

1. Field

The present disclosure relates to an electronic device including an organic semiconductor element and a method of making the same.

2. Description of the Related Technology

Active matrix organic light emitting displays (OLEDs) typically include thin film transistors (TFTs) for pixels. In order to reduce manufacturing costs, organic thin film transistors (OTFTs) can be used. A plurality of OTFTs are arranged in a matrix form. OTFTs have channels formed of an organic semiconductor (OSC) material.

In forming the channels of OTFTs, an organic semiconductor layer is formed on a substrate. The organic semiconductor layer can be patterned to separate the channels of neighboring OTFTs. As disclosed in GERWIN H. GELINCK et Al. "FLEXIBLE ACTIVE-MATRIX DISPLAYS AND SHIFT REGISTERS BASED ON SOLUTION-PROCESSED ORGANIC TRANSISTORS," Nature Materials 3, 106.110 (2004), patterning of an OSC material is desired to achieve good single transistor performance such as a high on/off current ratio. The patterning can also prevent unwanted cross talk effect between adjacent TFTs and between conductive lines in an electronic circuit of an OLED. A non-patterned semiconductor material can cause current leakage.

Direct patterning technologies such as additive printing can be used to pattern an OSC material. Examples of the additive printing include inkjet (I/J) printing and flexo printing. However, the printing methods often cause a non-uniform OSC layer profile due to, for example, drying of an ink. Therefore, a large OTFT-to-OTFT thickness variation can occur which reduces the uniformity of the brightness of the display. An alternative way is to use photolithography including etching processes. However, these processes are complicated, expensive and can damage an OSC material.

SUMMARY

One embodiment is a semiconductor element comprising a substrate having a patterned structure of an organic semiconductor (OSC) material which is cost-effective, realizes a structure having a high degree of uniformity of the patterned semiconductor regions, and avoids cross-talk between adjacent patterned semiconductor regions, an organic light emitting display including the semiconductor element, and a method of manufacturing the semiconductor element.

Another embodiment provides a method of making an electronic device, the method comprising: providing a substrate; forming an organic semiconductor layer over the substrate; and selectively applying a chemical compound to a portion of the organic semiconductor layer so as to dissolve the portion without using a mask or structure formed over the organic semiconductor layer and selectively exposing the portion.

Selectively applying the chemical compound may comprise using inkjet printing. The chemical compound may be in a liquid form. The chemical compound may comprise at least one selected from the group consisting of chloroform, tetra hydro furan (THF), xylene, hexane, toluene, cyclohexane, anisole, 3,4-dimethylanisole, 1,2-dichlorobenzene, tetralin, 1,2,4-trimethylbenzene, 1,2,3-trimethlbenzene, 1,3,5-trimethlbenzene, methyl benzoate, and ethyl benzoate. The organic semiconductor layer may comprise at least one selected from the group consisting of poly-3-alkylthiophene, poly-co-(dioctylfluorenyl-dithiophen-yl), poly-alkyltriarylamine, dihexylsexithiophene, starshaped oligothiophenes, poly(alkylterthiophene), poly(alkylquarterthiophene), acenes, and bis-(triethylsilylethinyl)-anthradithiophene.

The acenes may comprise pentacenes. The pentacenes may comprise Bis-(tri-isopropylsilylethinyl)-pentacene, Bis-(triethylsilylethinyl)-pentacene, and Bis-(tri-methylsilylethinyl)-pentacene. Forming the organic semiconductor layer may comprise applying at least one of N-acetyl-6,13-epithioimino-6,13-dihydropentacene-S-oxide and 6,13-epitetrachlorbenzo-6,13-dihydropentacene over the substrate.

The method may further comprise removing the portion of the organic semiconductor layer after selectively applying the chemical compound. Removing the portion of the organic semiconductor layer may comprise evaporating the chemical compound.

The substrate may comprise a first region and a second region neighboring the first region, wherein forming the organic semiconductor layer may comprise forming the organic semiconductor layer continuously over the first and second regions of the substrate, and wherein selectively applying the chemical compound may comprise applying the chemical compound only over the second region.

Removing the portion of the organic semiconductor layer may comprise removing substantially the entire portion of the organic semiconductor layer from over the second region of the substrate. Removing the portion of the organic semiconductor layer may comprise removing part of the organic semiconductor layer from over the second region of the substrate such that the minimum thickness of the organic semiconductor layer over the first region may be at least about five times greater than the maximum thickness of the organic semiconductor layer over the second region.

The electronic device may comprise a plurality of organic thin film transistors (TFTs), each of the TFTs comprising a pair of source and drain electrodes; wherein the method may further comprise, prior to forming the organic semiconductor layer, forming a plurality of pairs of source and drain electrodes over the substrate, each of the pairs having a gap between the source and drain electrode of the pair, the pairs being positioned lateral to one another; and wherein forming the organic semiconductor layer may comprise forming the organic semiconductor layer so as to continuously cover the pairs of the source and drain electrodes.

The portion of the organic semiconductor layer may comprise a first portion of the organic semiconductor layer formed between two of the pairs. The method may further comprise forming gate electrodes such that each of the gate electrodes opposes the gap between the source and drain electrode of one of the pairs.

The gate electrodes may be formed prior to forming the organic semiconductor layer, and the method may further comprise forming an insulating layer after forming the gate electrodes and prior to forming the organic semiconductor layer. The gate electrodes may be formed after removing the portion of the organic semiconductor layer, and the method may further comprise forming an insulating layer after removing the portion of the organic semiconductor layer and prior to forming the gate electrodes.

Another embodiment provides an electronic device made by the method described above. The device may comprise an organic light emitting display device.

Yet another embodiment provides an electronic device comprising: a substrate; and a patterned structure formed over the substrate, the patterned structure comprising a first region and a second region neighboring the first region, wherein the first region comprises an organic semiconductor material having a thickness equal to or greater than a first thickness, and the second region comprises substantially no organic semiconductor material or an organic semiconductor material having a thickness equal to or less than a second thickness, the second thickness being less than the first thickness, wherein the first region includes an edge portion and a non-edge portion, the edge portion extending along and proximate to the second region, and wherein the organic semiconductor material in the edge portion of the first region protrudes upward relative to the organic semiconductor material in the non-edge portion of the first region.

The first thickness may be at least about five times as thick as the second thickness. The organic semiconductor material in the edge portion may have a thickness at least about 10% greater than that of the organic semiconductor material in the non-edge portion. The organic semiconductor material in the edge portion may have a thickness about 30% to about 300% greater than that of the organic semiconductor material in the non-edge portion.

The electronic device may comprise a plurality of organic thin film transistors (TFTs), each of the TFTs comprising a pair of source and electrodes; wherein the patterned structure substantially overlies and contacts the pairs of source and drain electrodes of the TFTs; and wherein the second region may be formed between two of the pairs of source and drain electrodes. The device may comprise a display device. The display device may comprise an organic light emitting display device.

Another embodiment uses a new approach to combine the benefits of large area solution coating processes for applying a continuous OSC layer and ink jet printing of a solvent for patterning the organic semiconductor layer. This advantageously results in a uniform OSC layer thickness and a low OTFT-to-OTFT variation. Furthermore, only two cheap steps for the OSC patterning process are required. Various solution deposition methods can be used for applying a continuous OSC layer (to deposit the OSC material) which results in uniform film forming: spin coating, blade coating, dip casting and the like. Once the continuous OSC layer is formed, a second step is used to pattern the continuous OSC layer. Ink jet printing can be used to print solvents and dissolve the OSC layer around the single OTFTs (which one of a plurality of OTFTs). The patterning can, for example, form a "ring" of a non OSC area around the OTFTs and can therefore prevent a current leakage path and unwanted cross talk effects. The present invention can be used for both bottom gate and top gate OTFTs.

Yet another embodiment is a method of manufacturing a semiconductor element comprising a substrate (e.g., a glass or plastic substrate) having a patterned structure of an organic semiconductor material is disclosed, wherein the patterned structure comprises a plurality of first regions, wherein each first region comprises an organic semiconductor material having a thickness being equal or higher than a first thickness, and a plurality of second regions, wherein each second region comprises no organic semiconductor material or wherein each second region comprises an organic semiconductor material having a thickness equal or lower than a second thickness, the method comprising: providing a substrate; applying a continuous layer of an organic semiconductor material onto the substrate; applying a solvent onto the continuous layer in the second regions thereby dissolving and removing the organic semiconductor material, which is located in the second regions, from the continuous layer. The plurality of first regions may not be interconnected to each other. The plurality of second regions can be either interconnected to each other or be separated from each other. According to one embodiment, "a plurality" of OTFTs means at least two OTFT, optionally more than 100 OTFTs. The same (analogous) meaning applies to "a plurality" of first regions, etc.

The semiconductor material may be substantially completely removed by applying a solvent locally. During drying, the semiconductor material of the dissolved area retracts towards the remaining solid semiconductor material, resulting in a region without semiconductor material.

The semiconductor material may be substantially completely removed by the application of the solvent. According to another embodiment, the organic semiconductor material may be removed (by the application of the solvent) such that the minimum thickness of the organic semiconductor material in the first regions is at least five times higher (e.g., at least eight times higher or at least ten times higher) than the thickness of the organic semiconductor material in the second regions.

The application of the solvent onto the second regions may be carried out by ink jet printing of the solvent onto the second regions. At least one of poly-3-alkylthiophene, poly-co-(dioctylfluorenyl-dithiophen-yl), poly-alkyltriarylamine, dihexylsexithiophene, starshaped oligothiophenes, poly(alkylterthiophene), poly(alkylquarterthiophene), functionalized acenes, functionalized pentacenes and bis-(tri-ethylsilylethinyl)-anthradithiophene) may be used for the organic semiconductor material.

A solvent having a boiling point between about 100° C. and about 180° C. is used. At least one of Bis-(Tri-isopropylsilylethinyl)-Pentacene, regioregular Poly-3-hexylthiophene and regioregular Poly-3-decylthiophene may be used for the organic semiconductor material. One of N-acetyl-6,13-epithioimino-6,13-dihydropentacene-S-oxide and 6,13-epitetrachlorbenzo-6,13-dihydropentacene may be used as a pentacene precursor. At least one of chloroform, tetra hydro furan (THF), xylene, hexane, toluene, cyclohexane, anisole, 3,4dimethylanisole, 1,2dichlorobenzene, tetralin, 1,2,4trimethylbenzene, 1,2,3trimethlbenzene, 1,3,5trimethlbenzene, methyl benzoate, ethyl benzoate may be used for the solvent.

According to another embodiment, a plurality of pairs of source electrodes and drain electrodes are applied onto the substrate prior to the step of applying a continuous layer of an organic semiconductor material.

The method may further comprise: forming an insulating layer on the patterned structure and forming a plurality of gate electrodes on the insulating layer in areas between source electrodes and drain electrodes of the same pair.

According to another embodiment, a plurality of gate electrodes are formed on the substrate. An insulating layer is formed on the plurality of gate electrodes. A plurality of pairs of source electrodes and drain electrodes are formed on the insulating layer prior to the step of applying a continuous layer of an organic semiconductor material.

At least one second region may be formed between adjacent pairs of source and drain electrodes wherein no second region is formed between the source electrode and drain electrode of the same pair. Two second regions may be formed between adjacent pairs of source and drain electrodes. The plurality of transistors (one transistor is formed by one source, one drain and one gate wherein a channel of the organic semiconductor material is disposed between the source and drain, and wherein an insulating layer is arranged between the gate and the channel) are spaced apart by a uniform distance from one another and are arranged in a matrix shape on the substrate.

The solvent may be applied to cover an annular area thereby forming a second region or second regions (comprising no organic semiconductor material due to the fact that the solvent dissolves and removes the organic semiconductor material in the second region) comprising an annular shape. The solvent may be applied such each OTFT is fully surrounded by a second region. The second regions can be separated from adjacent second regions or can be interconnected with each other. The first regions may comprise a circular shape. Each transistor may be fully covered by one first region which is not interconnected with a first region covering an adjacent OTFT.

In an alternative embodiment, the solvent is applied in lines which extend along a vertical or horizontal axis of the matrix (or the edges of the substrate). The lines may be located between adjacent rows or columns of transistors. Furthermore, the solvent may be applied in both vertical and horizontal lines of the matrix. Therefore, the second regions may comprise a line shape or stripe shape wherein the first regions comprise a square shape covering the OTFT channels. The continuous layer of an organic semiconductor material may be applied with a layer thickness between about 10 and about 200 nm, optionally between about 20 and about 100 nm. Furthermore, the line width of the printed solvent, i.e., the width of the second regions, may be between about 10 and about 200 μm, optionally between about 20 and about 100 μm.

A combination of an organic semiconductor material and solvent may be Bis-(Tri-isopropylsilylethinyl)-Pentacene having a concentration of about 1% to about 10% (optionally about 2% to about 6%, and particularly about 4%) solution in tetralin for deposition of the continuous semiconductor layer by, for example, spin coating and xylene for patterning of the same by a solvent drop method.

According to another embodiment, a semiconductor element comprising a substrate (e.g., a planar glass or plastic substrate) having a patterned structure of an organic semiconductor material is disclosed. The patterned structure comprises a plurality of first regions, wherein each first region comprises an organic semiconductor material having a thickness equal or higher than a first thickness, and a plurality of second regions, wherein each second region comprises no organic semiconductor material or wherein each second region comprises an organic semiconductor material having a thickness equal or lower than a second thickness, wherein at least one second region (optionally a plurality of second regions) comprises traces of a solvent and/or wherein the edge areas of the first regions comprise a higher thickness than the central areas of the first regions, i.e., at least one edge area of at least one first region comprises a higher thickness than at the central area of the at least one first region, and the edge areas of all first regions comprise a higher thickness than the central areas of all first regions.

The second regions comprise no organic semiconductor material. According to another embodiment, the minimum thickness of the organic semiconductor material in the first regions is higher (e.g., at least five times higher, at least eight times higher, or at least ten times higher) than the maximum thickness of the organic semiconductor material in the second regions. The thickness of an edge area of at least one first region is higher (at least about 10% higher) than the thickness of the central area of the at least one first region. In one embodiment, the thickness of the edge area of the first regions is between about 30% and about 300% (optionally between about 50% and about 150%) higher than the thickness of the central area of the first regions.

The semiconductor element may form at least one organic thin film transistor (OTFTs). For a top gate OTFT, a plurality of pairs of source electrodes and drain electrodes are arranged between the substrate and the organic semiconductor material (first regions) and an insulating layer is arranged on the patterned structure (of first and second regions) and a plurality of gate electrodes is arranged on the insulating layer in areas between source electrodes and drain electrodes of the same pair.

For a bottom gate OTFT, a plurality of gate electrodes are formed between the substrate and an insulating layer, whereby a plurality of pairs of source electrodes and drain electrodes are formed on the insulating layer and at least one second region is formed between adjacent pairs of source and drain electrodes wherein no second region is formed between source electrodes and drain electrodes of the same pair.

The semiconductor element having a plurality of OTFTs is used for an organic light emitting display. The plurality of OTFTs are electrically connected to organic light emitting diode (as switching or driving transistors).

BRIEF DESCRIPTION OF THE DRAWINGS

The above and other features and advantages of the instant disclosure will become more apparent by describing in detail exemplary embodiments thereof with reference to the attached drawings in which.

DETAILED DESCRIPTION

The instant disclosure will now be described more fully with reference to the accompanying drawings in which exemplary embodiments are shown.

Figure 1A:
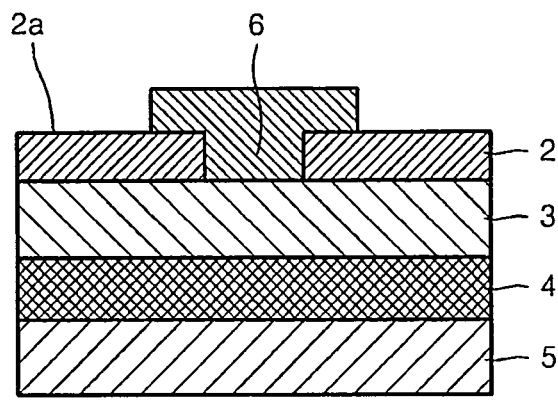
FIG. 1A shows a cross-sectional view of a bottom gate organic thin film transistor.
Figure 1B:
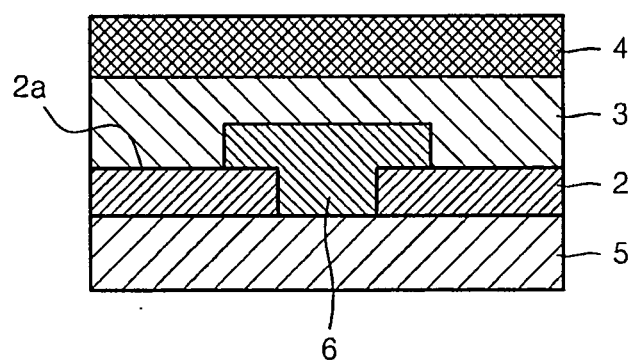
FIG. 1B shows a cross-sectional view of a top gate organic thin film transistor.

FIGS. 1A and 1B show cross sectional views of a bottom gate (FIG. 1a) and a top gate (FIG. 1b) organic thin film transistor. Each of the transistors includes a substrate 5, a gate 4, an insulating layer 3, a source 2, a drain 2a and a channel 6 formed of an organic semiconductor material (OSC). In certain applications, e.g., for display devices having an active matrix display, a substrate includes a plurality of OTFTs (bottom gate or top gate OTFTs) to function as driving transistors or switching transistors. For example, an organic active matrix light emitting display includes a substrate including a plurality of pixels. Each pixel includes at least one OTFT and at least one organic light emitting device. Each pixel is electrically connected to at least one of a plurality of scan lines and to at least one of a plurality of data lines. For a high degree of uniformity of brightness, the electric characteristics of the plurality of OTFTs need be substantially uniform. Furthermore, there is a need to prevent cross-talk between neighboring OTFTs.

Figure 2:
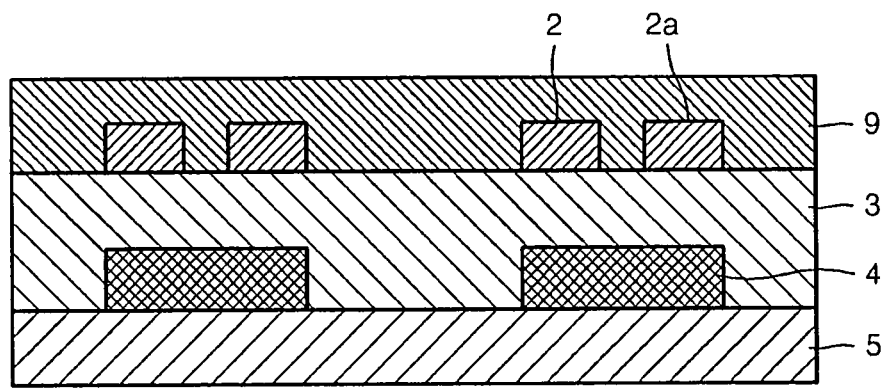
FIG. 2 is a cross-sectional view illustrating a step of a method of forming bottom gate organic thin film transistors (OTFTs) according to one embodiment.

FIG. 2 illustrates a method according to an embodiment. FIG. 2 is a cross sectional view of part of a plurality of bottom gate OTFTs comprising a solution deposited continuous organic semiconductor layer. According to one embodiment, a plurality of OTFTs can be cost-effectively manufactured (either bottom gate or top gate OTFTs) while reducing cross-talk between adjacent OTFTs and increasing the uniformity of the electric characteristics of the plurality of OTFTs.

In the illustrated embodiment for forming bottom gate OTFTs (as shown in FIG. 2), gate electrodes 4 are formed over a substrate 5. Then, an insulating layer 3 is formed over the substrate 5 to cover the gate electrodes 4. Subsequently, a plurality of pairs of source and drain electrodes 2, 2a are formed on the insulating layer 3. Then, a continuous layer 9 of an organic semiconductor material is applied to cover the insulating layer 3 and the plurality of source and drain electrodes 2, 2a, forming a channel between the source and drain electrodes 2, 2a. Subsequently, the organic semiconductor material layer 9 is patterned as will be better understood from description below.

Figure 5:
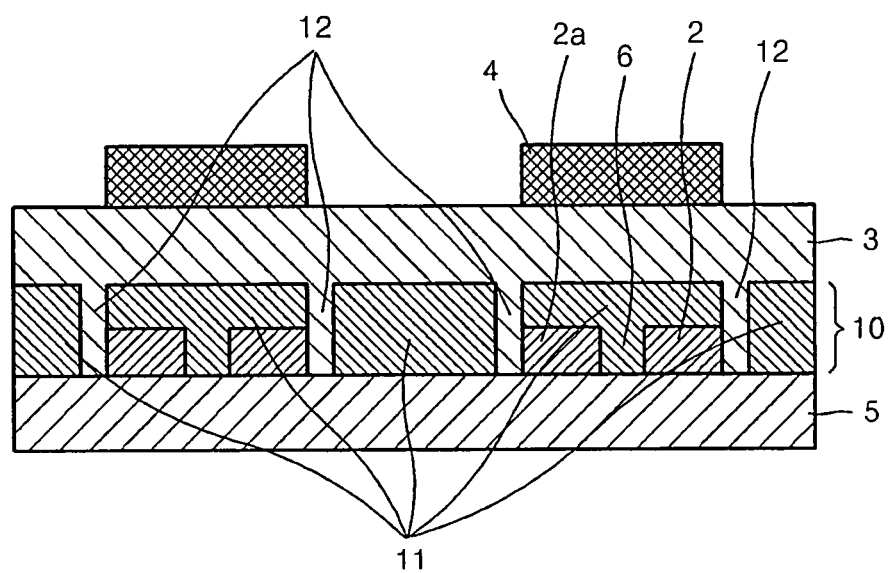
FIG. 5 shows a cross sectional view of top gate OTFTs comprising a patterned OSC layer manufactured according to another embodiment

In another embodiment for forming top gate OTFTs (not shown), source and drain electrodes are formed over a substrate. Then, an organic semiconductor layer is formed over the substrate to cover the source and drain electrodes. The organic semiconductor layer is patterned as will be better understood from description. Then, an insulating layer is formed over the organic semiconductor layer. Subsequently, gate electrodes are formed over the insulating layer, as shown in FIG. 5.

Figure 3:
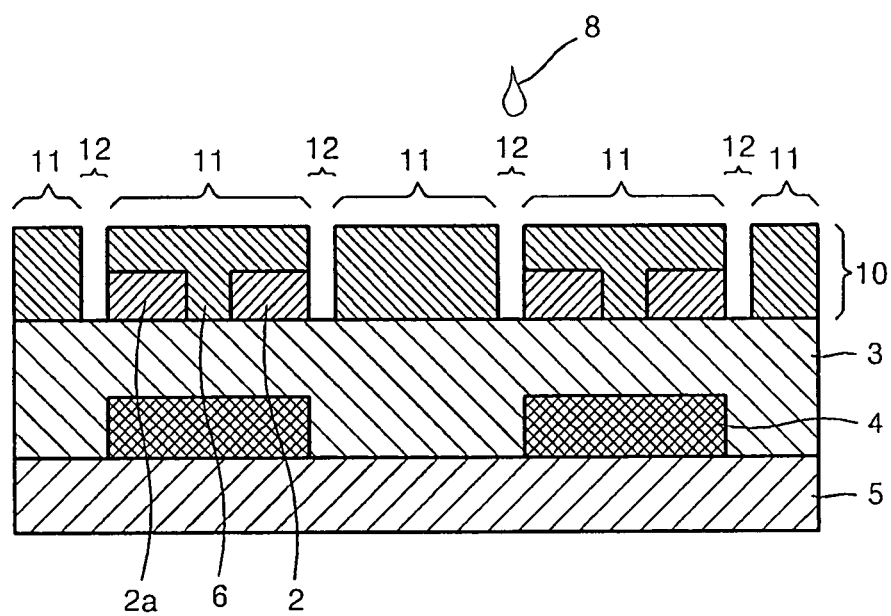
FIG. 3 is a cross-sectional view illustrating another step of the method of FIG. 2.

As illustrated in FIG. 3, after forming the continuous layer 9 of the organic semiconductor material, a solvent 8 is selectively applied onto portions of the continuous layer 9 to dissolve and remove the portions of the layer 9. This step provides a plurality of first regions 11 which include the organic semiconductor material and a plurality of second regions 12 which do not include the organic semiconductor material. Thus, a patterned structure 10 of the organic semiconductor material is formed.

The solvent 8 is applied such that the channel 6 of each of the plurality of OTFTs is surrounded by a second region 12 or second regions 12. However, the first regions 11 are defined so as not to connect neighboring OTFTs to one another. The plurality of OTFTs is arranged in a matrix form on the substrate 5. The second regions 12 can be linear or annular so as to at least partially surround each of the OTFTs. It shall be understood that portions of the continuous layer 9 are dissolved and removed by the solvent 8 such that none of the OTFTs is interconnected to neighboring OTFTs via the organic semiconductor material or via one of the first regions 11. Therefore, cross-talk between adjacent OTFTs can be avoided. The method is furthermore advantageous in comparison to direct patterning technologies (e.g. ink jet printing of the organic semiconductor material) because the uniformity of the OTFTs is increased because the continuous layer 9 has high uniformity in thickness, resistance, etc. (ink jet printing causes a non-uniform OSC layer profile due to, for example, drying of ink).

For manufacturing a display according to one embodiment, a plurality of organic light emitting devices are formed over a substrate. Referring to FIG. 3, the organic light emitting devices (not shown) and the OTFTs (including a source 2, drain 2a, channel 6, insulating layer 3, and gate 4) form pixels which are electrically connected to driving circuits, such as a data driver and a scan driver (not shown). A skilled technologist will appreciate that one pixel of an active matrix display usually requires more than one OTFTs. Therefore, according to one embodiment, two or more OTFTs can be manufactured. The OTFTs can be arranged in a matrix pattern to form circuitry for the pixels of an organic light emitting device.

Figure 4:
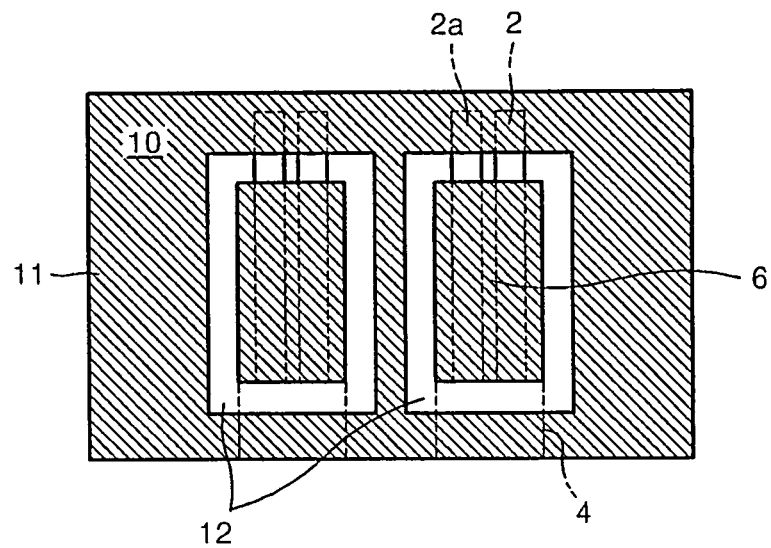
FIG. 4 shows a top plan view of a plurality of a bottom gate OTFTs including a patterned OSC layer manufactured according to one embodiment.

Referring to FIG. 4, two OTFTs are arranged adjacent to each other. FIG. 4 only shows two of a plurality of TFTs, and does not show adjacent OTFTs. Regardless of the arrangement of the OTFTs on the substrate (depending on the driving circuitry of the display), the channel 6 of each OTFTs is formed from a continuous layer 9 of the organic semiconductor material. Portions of the organic semiconductor material are dissolved and removed using a solvent 8 such that each channel 6 is separated from an adjacent channel 6 or adjacent channels 6 by at least one second region 12. In one embodiment, the second region 12 may include substantially no organic semiconductor material.

FIG. 5 is a cross sectional-view of a plurality of top gate OTFTs. The OTFTs include an OSC layer patterned by selectively applying a solvent 8 onto a continuous OSC layer 8 in order to dissolve portions of the OSC layer around each OTFT.

Figure 6:
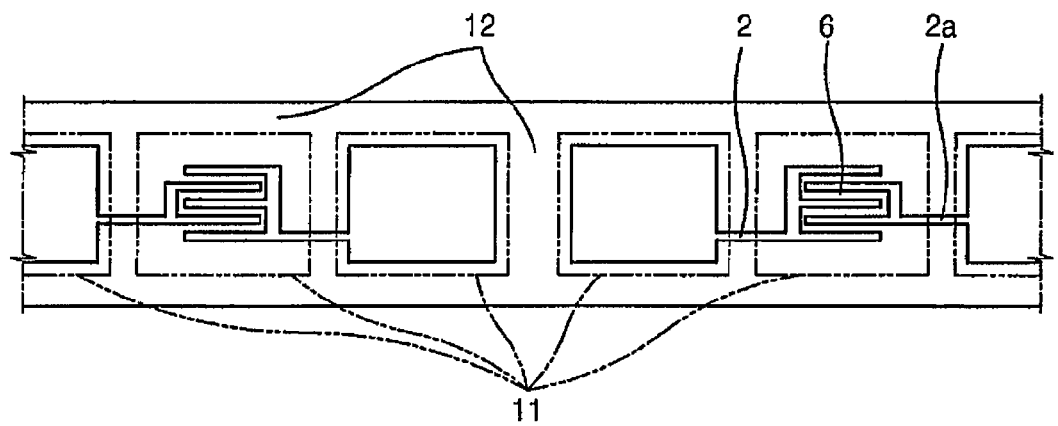
FIG. 6 shows a top plan view of top gate OTFTs comprising a patterned OSC layer manufactured according to another embodiment

FIG. 6 is a top plan view of a plurality of top gate OTFT before forming gate electrodes. Referring to FIG. 6, organic semiconducting materials are present in first regions 11, while no organic semiconducting materials are present in second regions 12 due to applying a solvent to the second regions 12. The organic semiconducting materials in the first regions 11 of each of the plurality of OTFTs contact a source electrode 2 and a drain electrode 2a to form a channel 6.

Figure 7:
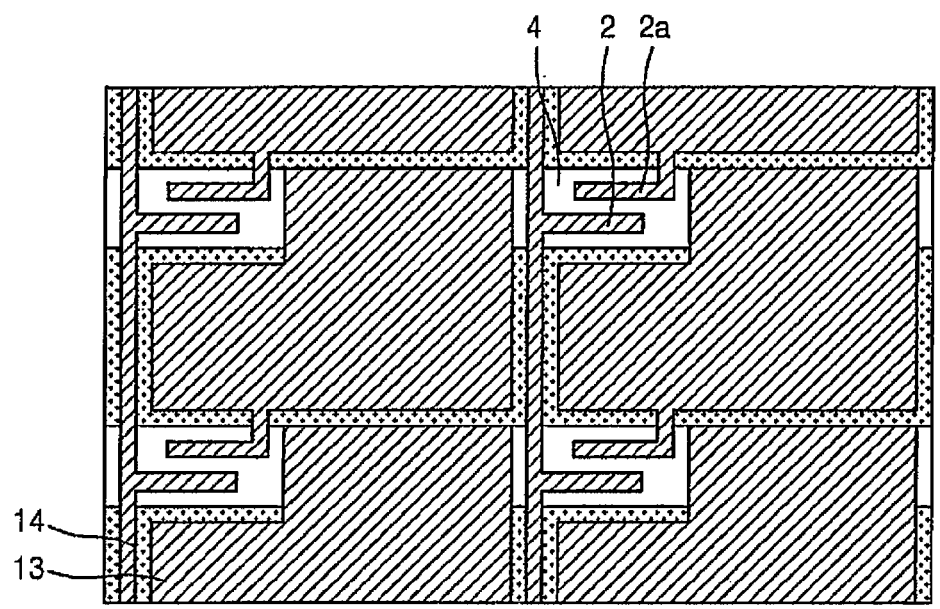
FIGS. 7-10 are top plan views illustrating a method of manufacturing a display comprising a plurality of pixels, each pixel comprising OTFTs according to one embodiment.
Figure 8:
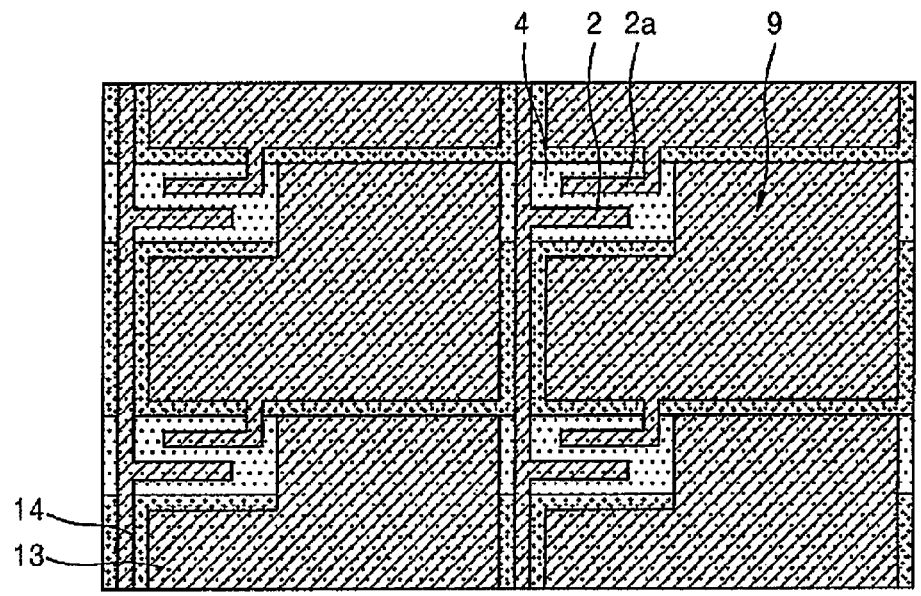

FIGS. 7 to 10 are top plan views illustrating a method of forming an active matrix backplane including a plurality of a bottom gate OTFTs, a wire 14, and pixel electrodes 13. FIG. 7 shows a substrate with source and drain electrodes 2, 2a formed thereon. The next process step is shown in FIG. 8. During this process, substantially the entire portion of the substrate is covered with an organic semiconductor material.

Figure 9:
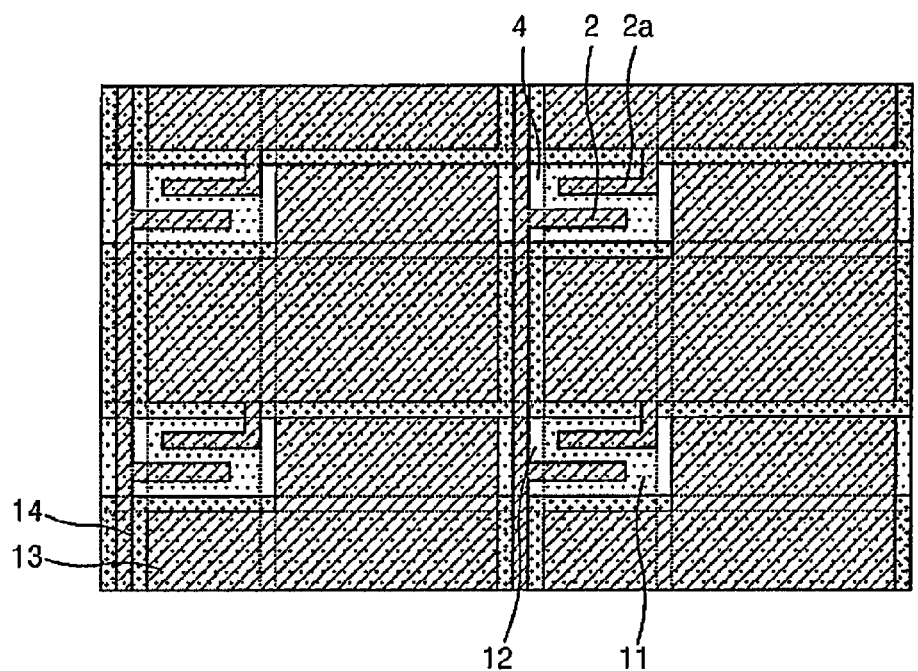
Figure 10:
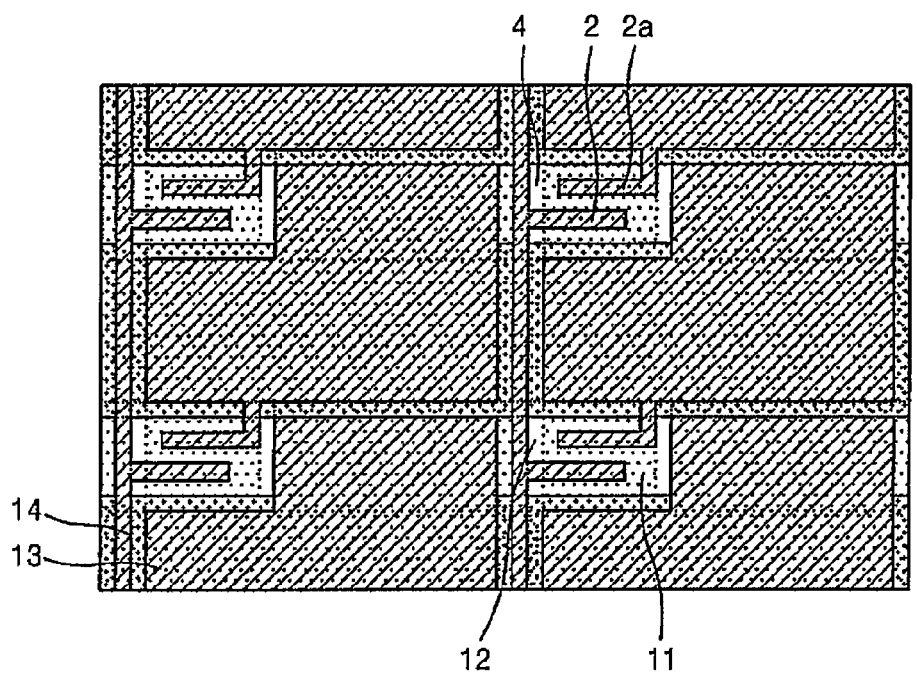

In FIG. 8, the area where dots are indicated denotes a portion where the continuous organic semiconductor layer 9 is coated. In FIGS. 9 and 10, the area where dots are removed denotes a portion where the coated continuous organic semiconductor layer 9 is removed. FIGS. 9 and 10 show two ways to structure the OSC by the solvent printing method, i.e., by the application of a solvent for removing portions of the organic semiconductor material. FIG. 9 illustrates a simple line printing process and FIG. 10 demonstrates an OTFT by OTFT annular printing. FIG. 9 illustrates an embodiment in which a solvent is applied along a straight line over a plurality of OTFTs, while FIG. 10 demonstrates an embodiment in which a solvent is applied along an annular line encompassing a center portion of each OTFT. The solvent is provided to form the first regions 11 and the second regions 12.

Figure 11:
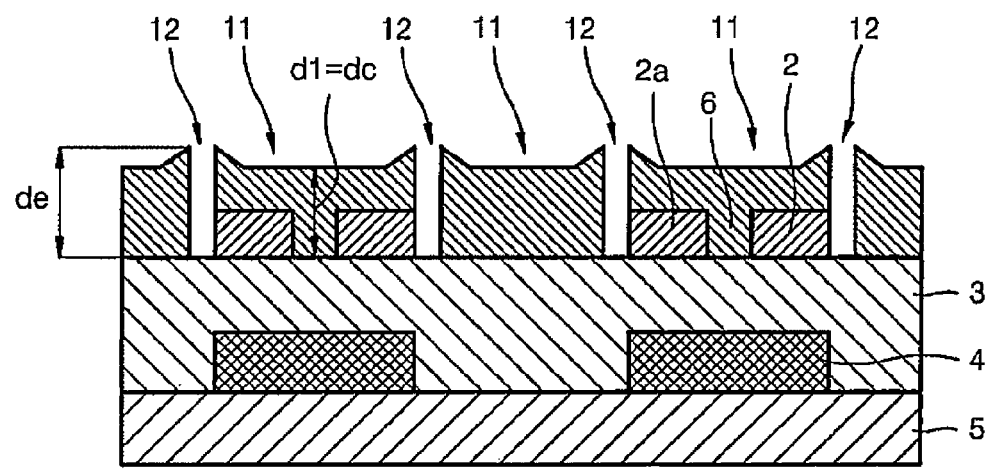
FIG. 11 is a cross-sectional view of organic thin film transistors according to one embodiment.
Figure 12:
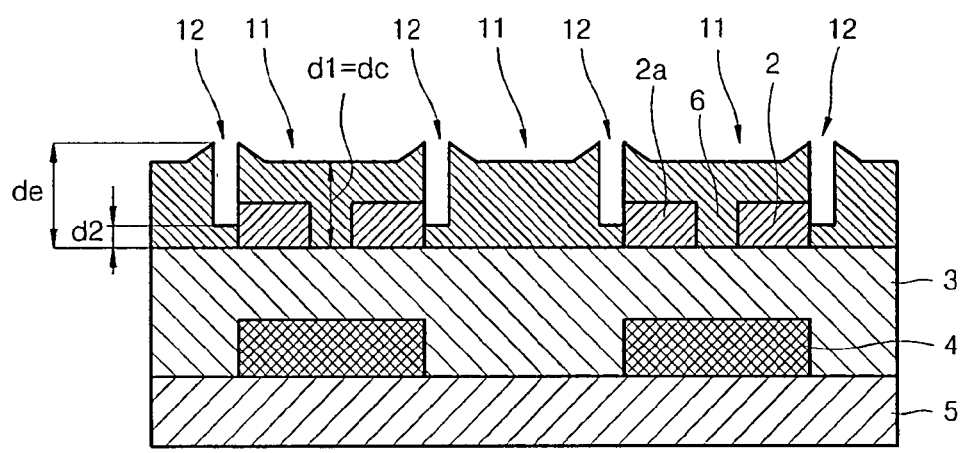
FIG. 12 is a cross-sectional view of organic thin film transistors according to another embodiment.

FIGS. 11 and 12 show schematic cross-sectional views of two different embodiments of the OSC patterning method. In both figures, OSC material accumulation around the dissolved area is shown. FIG. 12 shows a sufficient reduction of OSC layer thickness to decrease conductivity (thereby sufficiently avoiding cross-talk) while FIG. 11 illustrates the complete elimination of the OSC to minimize conductivity (and cross-talk).

As shown in FIGS. 11 and 12, portions of the organic semiconductor material are dissolved and removed by a solvent. Part of the organic semiconductor material accumulates on the remaining solid organic semiconductor material, which results in an increase in the thickness of the first regions 11. In the illustrated embodiment, each of the first regions 11 includes an organic semiconductor material having a thickness equal or greater than a first thickness d1. Each of the second regions 12 has substantially no organic semiconductor material or an organic semiconductor material having a thickness equal or smaller than a second thickness d2. The thickness de of the edge areas of the first regions 11 is greater than the thickness (dc=d1) of the central areas of the first regions 11. In this case, the thickness de of the edge areas of the first regions 11 is at least about 10% greater than the thickness dc of the central areas of the first regions 11. In particular, a repetitive test shows that the thickness de of the edge areas of the first regions 11 is between about 30% and about 300% greater than the thickness dc of the central areas of the first regions 11.

Meanwhile, as illustrated in FIG. 12, if the organic semiconductor material remains in the second regions 12, the minimum thickness of the organic semiconductor material in the first regions 11 is at least about five times greater than the thickness of the organic semiconductor material in the second regions 12 in order to avoid cross-talk between adjacent OTFTs.

The organic TFTs have good flexibility, and thus, can be applied to various flexible flat display devices. Examples of the flexible flat display devices include liquid crystal display devices and organic light emitting display devices. Accordingly, an organic light emitting display devices having the above organic TFT will now be briefly described.

The embodiments described above can be used for various types of organic light emitting display devices. An organic light emitting display device according to one embodiment is an active matrix (AM) type light emitting display device having organic TFTs.

Each pixel unit includes at least one organic TFT as described above. A passivation film formed of $SiO_2$ is formed on the organic TFT. A pixel defining film formed of acryl or polyimide is formed on the passivation film. The passivation film serves to protect the organic TFT while planarizing an upper surface of the organic TFT.

An organic light emitting device is electrically connected to the organic TFT. The organic light emitting device includes a pixel electrode and a facing electrode facing each other. The organic light emitting device also includes an intermediate layer interposed therebetween. The intermediate layer includes at least a light emitting layer. The facing electrode can have various forms. For example, the facing electrode can be a common electrode to a plurality of pixels.

The intermediate layer may be patterned to define subpixels. In other embodiments, the intermediate layer can be a single layer common to neighboring sub-pixels. Also, the intermediate layer can have various forms. For example, portions of the intermediate layers can be patterned for individual sub-pixels while other portions of the intermediate layer can be a single layer common to several neighboring sub-pixels.

The pixel electrode functions as an anode electrode and the facing electrode functions as a cathode electrode. In another embodiment, the polarity of the first and second electrode layers can be reversed.

The pixel electrode can be formed of a transparent electrode or a reflective electrode. When the pixel electrode is formed of a transparent electrode, the pixel electrode can be formed of ITO, IZO, ZnO or $In_2O_3$. Wen the pixel electrode is formed of a reflective electrode, the pixel electrode can include ITO, IZO, ZnO or $In_2O_3$ on a reflective film. The reflective film can be formed of Ag, Mg, Al, Pt, Pd, Au, Ni, Nd, Ir, Cr, or an alloy of two or more of the foregoing.

The facing electrode can also be formed of a transparent electrode or a reflective electrode. When the facing electrode is formed of the transparent electrode, the facing electrode can include a layer formed of Li, Ca, LiF/Ca, LiF/Al, Al, Ag, Mg, or a compound of two or more of the foregoing, The facing electrode can also include an auxiliary electrode or a bus electrode line formed on the layer of a transparent conductive material, such as ITO, IZO, ZnO or $In_2O_3$. When the facing electrode is formed of the reflective electrode, the facing electrode can be formed of Li, Ca, LiF/Ca, LiF/Al, Al, Ag, Mg, or a compound of two or more of the foregoing.

The intermediate layer interposed between the pixel electrode and the facing electrode can be formed of a low molecular weight organic material or a polymeric material. If the intermediate layer is formed of a low molecular weight organic material, the intermediate layer can have a single or a composite structure. The composite structure can be formed by stacking a hole injection layer (HIL), a hole transport layer (HTL), an emission layer (EML), an electron transport layer (ETL), and an electron injection layer (EIL). Examples of the organic material that can be used for forming the intermediate layer include copper phthalocyanine (CuPc), N,N'-Di(naphthalene-1-yl)-N,N'-diphenyl-benzidine (NPB), and tris-8-hydroxyquinoline aluminum (Alq3). The intermediate layer formed of a low molecular weight organic material can be formed by a vacuum evaporation method using masks.

The intermediate layer formed of a polymeric material can have a structure having a HTL and an EML. PEDOT can be used for the HTL. Polymer organic materials such as polyphenylenevinylene (PPV) group and polyfluorene can be used for the EML.

An organic light emitting device formed on the substrate is sealed using a facing member. The facing member can be formed of a glass or plastic material, and can include a metal cap.

In an organic light emitting display device as described above, a light emitting display device that displays correct images according to input image signals can be manufactured by including organic TFTs according to the embodiments described above.

The embodiments described above can provide a patterned organic semiconductor layer having a high degree of uniformity at reduced costs. Devices including the organic semiconductor structure can have substantially no cross-talk.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims.

What is claimed is:
1. An electronic device comprising:
a substrate;

a patterned structure formed over the substrate, the patterned structure comprising a plurality of first regions and second regions neighboring the first regions; and a gate electrode, a source electrode and a drain electrode;

wherein each first region of the plurality of first regions comprises organic semiconductor material, wherein at least one of the first regions contact the source and drain electrodes to form a channel, wherein at least another one of the first regions does not contact the source electrode or the drain electrode, wherein the first regions are not connected to each other and wherein the second regions contact at least one of the first regions that does not contact the gate electrode or source electrode;

wherein the second regions are between the first regions and comprise no semiconductor material, wherein each first region includes two edge portions and a non-edge portion, the two edge portions extending along and proximate to each second region of the plurality of second regions, wherein the organic semiconductor material in the two edge portions of each first region that does not contact the gate electrode or source electrodes protrudes upward relative to the organic semiconductor material in the non-edge portion of each first region; and wherein an insulating layer is between the gate electrode and the source and drain electrodes, wherein the insulating layer is between the substrate and the source electrode and drain electrode and wherein neither of the source electrode or the drain electrode contact the gate electrode or the substrate.

2. The device of claim 1, wherein the organic semiconductor material in the edge portion has a thickness at least about 10% greater than that of the organic semiconductor material in the non-edge portion.

3. The device of claim 2, wherein the organic semiconductor material in the edge portion has a thickness about 30% to about 300% greater than that of the organic semiconductor material in the non-edge portion.

4. The device of claim 1, wherein the electronic device comprises a plurality of organic thin film transistors (TFTs), each of the TFTs comprising a pair of source and drain electrodes;

wherein the patterned structure substantially overlies and contacts the pairs of source and drain electrodes of the TFTs; and wherein at least one second region is formed between two of the pairs of source and drain electrodes.

5. The device of claim 1, wherein the device comprises a display device.

6. The device of claim 5, wherein the display device comprises an organic light emitting display device.

* * * * *